United States Patent
Oishi et al.

(10) Patent No.: US 6,657,620 B2
(45) Date of Patent: Dec. 2, 2003

(54) FLAT PANEL TYPE DISPLAY APPARATUS

(75) Inventors: Toshiharu Oishi, Shizuoka-ken (JP); Tamotsu Harada, Shizuoka-ken (JP); Masakazu Kurumada, Shizuoka-ken (JP)

(73) Assignees: Pioneer Corporation, Tokyo (JP); Pioneer Display Products Corporation, Shizuoka-ken (JP)

( * ) Notice: Subject to any disclaimer, the term of this patent is extended or adjusted under 35 U.S.C. 154(b) by 267 days.

(21) Appl. No.: 09/809,220

(22) Filed: Mar. 16, 2001

(65) Prior Publication Data
US 2001/0024198 A1 Sep. 27, 2001

(30) Foreign Application Priority Data
Mar. 21, 2000 (JP) .................................. 2000-078490

(51) Int. Cl.$^7$ ................................ G09G 5/00
(52) U.S. Cl. .................... 345/204; 345/87; 345/106; 345/205; 345/206; 345/905; 315/169.2; 315/169.3; 257/503; 257/668; 361/679; 361/681; 361/687; 349/50; 349/60
(58) Field of Search ................... 345/204–206, 345/106, 905, 87; 315/169.2–169.3; 257/503, 668; 361/679, 681, 687; 349/50, 60

(56) References Cited

U.S. PATENT DOCUMENTS

| | | | | |
|---|---|---|---|---|
| 5,583,529 A | * | 12/1996 | Satou | 345/87 |
| 5,754,171 A | * | 5/1998 | Stoller | 345/205 |
| 5,763,940 A | * | 6/1998 | Shibusawa et al. | 257/668 |
| 5,971,566 A | * | 10/1999 | Tani et al. | 362/294 |
| 5,990,618 A | * | 11/1999 | Morita et al. | 313/582 |
| 6,275,220 B1 | * | 8/2001 | Nitta | 345/204 |
| 6,407,508 B1 | * | 6/2002 | Kawada et al. | 315/169.3 |
| 2002/0043607 A1 | * | 4/2002 | Tajima | 248/473 |

* cited by examiner

Primary Examiner—Richard Hjerpe
Assistant Examiner—Henry N. Tran
(74) Attorney, Agent, or Firm—Arent Fox Kintner Plotkin & Kahn

(57) ABSTRACT

There is provided a flat panel type display apparatus which is superior in heat radiation, withstand voltage characteristic, and the like. A flexible substrate having driving devices for driving a display body mounted thereon is provided on the back surface of a metal chassis which supports the display body at the back surface thereof. The back surfaces of substrates of the driving devices which are semiconductor integrated circuit devices are polished to remove unnecessary oxide films therefrom, and formed of metal films on the back surfaces. The driving devices are disposed on the flexible substrate with the metal films facing upward, a solder paste is coated on the surfaces of the metal films and the surfaces of grounding wiring patterns formed on the flexible substrate, and a metal plate is disposed on both members through the solder paste. In the state, the driving devices are connected with the grounding wiring patterns through the metal plate by the re-flow soldering, and the flexible substrate having the driving devices and the metal plate mounted thereon are mounted on the back surface of the metal chassis.

7 Claims, 2 Drawing Sheets

FLAT PANEL TYPE DISPLAY APPARATUS

BACKGROUND OF THE INVENTION

1. Field of the Invention

The present invention relates to a flat panel type display apparatus such as a plasma display panel (hereinafter referred to as PDP) or the like, and more particularly it relates to mounting structure of a integrated circuit device for driving the flat panel type display apparatus.

2. Description of the Related Art

In these years, the PDP is developed, and particularly a color plasma display panel has been rapidly researched for development as a display apparatus of the next generation.

In order to achieve higher definition of a display screen in the research, necessitated is mounting of a multiplicity of integrated circuit devices for driving (hereinafter referred to as driving devices) in high density, and it is indispensable to have a mounting structure superior in heat radiation, capable of improving the withstand voltage characteristic, and the like, particularly when the driving devices for driving at a high voltage and high power such as the PDP are mounted in high density.

When the driving devices are connected with electrodes of the PDP using a mounting technology such as, for example, TAB (tape automated bonding), COP (chip on film), or the like, what is sought is to take a measure capable of sufficiently securing the heat radiation and the withstand voltage characteristic, and realizing a simple mounting structure.

SUMMARY OF THE INVENTION

Accordingly, an object of the present invention is to solve such problems, and more particularly to provide a flat panel type display apparatus comprising a mounting structure for driving devices capable of obtaining the superior heat radiation and withstand voltage characteristic, and realizing a simple structure and lower production cost. In order to achieve the above-described object, the present invention provides a flat panel type display apparatus, comprising a flat display body, a metal chassis for supporting the display body at the back surface thereof, a flexible substrate electrically connected with the display body, having predetermined wiring patterns including grounding wiring patterns formed thereon, driving devices mounted on the flexible substrate, a metal film formed on a back surface of each of the driving devices, and a metal plate for radiating heat provided between the metal chassis and the driving devices, wherein the metal film and the grounding wiring patterns mounted on the flexible substrate are fixed onto the metal plate for radiating the heat by soldering, so that the driving devices and the grounding wiring patterns can be electrically connected with each other.

With such structure, the heat generated when the display body is driven for displaying by the driving devices is efficiently conducted to the metal plate, thus the heat radiation can be improved. Furthermore, the back surfaces of the driving devices are conducted with the grounding wiring patterns of the flexible substrate through the metal plate, the withstand voltage characteristic can be improved.

Furthermore, the metal plate can be united with the flexible substrate in the same process as mounting of the driving devices on a printed substrate, thereby the production cost of the flat panel type display apparatus can be reduced. Moreover, the heat radiation and withstand voltage characteristic can be improved by such a simple mounting structure, thereby also advantages such as improvement in mounting density, and the like are achieved.

BRIEF DESCRIPTION OF THE DRAWINGS

These and other objects of and advantages of the present invention will become clear from the following description with reference to the accompanying drawings, wherein.

DETAILED DESCRIPTION OF THE PREFERRED EMBODIMENTS

Figure 1:
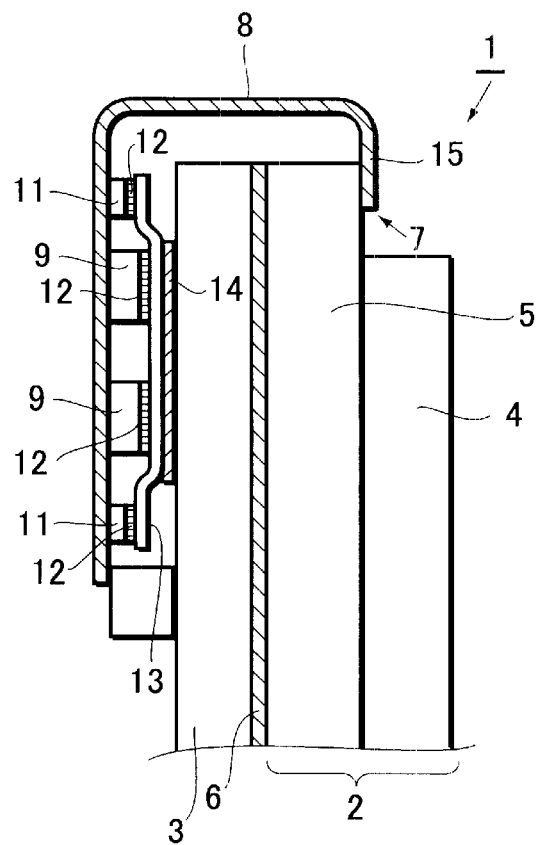
FIG. 1 is a sectional view illustrating a longitudinal sectional structure of a critical portion of a color plasma display panel according to an embodiment of the present invention.
Figure 2:
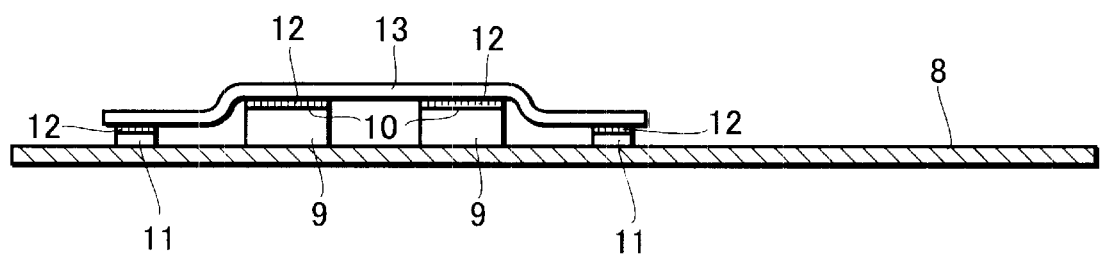
FIG. 2 is a schematic view illustrating a mounting structure for mounting driving devices using a flexible substrate.

Hereunder, an embodiment of a flat panel type display apparatus according to the present invention will be described with reference to FIGS. 1 and 2. It should be noted that a color plasma display panel having a mounting structure of driving devices according to the present invention is described as the embodiment of the flat panel type display apparatus. FIG. 1 is a sectional view illustrating a longitudinal sectional structure of a critical portion of the color plasma display panel, and FIG. 2 is a schematic view illustrating a mounting structure using a flexible printed substrate.

In FIG. 1, the color plasma display panel 1 comprises a display body 2, a metal chassis 3 for supporting the display body 2, and driving devices 9 and the like being wired for mounting on the back surface of the metal chassis 3 by a flexible substrate 8.

The display body 2, having a flat shape, comprises a front glass substrate 4 and a back glass substrate 5 arranged opposing each other with a discharge space having a rare gas sealed therein interposed therebetween. On an internal surface of the front glass substrate 4 (a surface facing to the back glass substrate 5), a multiplicity of row electrode pairs covered by dielectric layers are regularly arranged, and on an internal surface of the back glass substrate 5 (a surface facing to the front glass substrate 4), a multiplicity of column electrodes covered by fluorescent material layers of respective colors are orthogonally arranged relative to the row electrode pairs. Respective intersections of the row electrode pairs and the column electrodes work as color discharge cells. When the driving devices 9 supply driving power for displaying to the row electrode pairs and column electrodes based on display data, the color discharge cells are discharged to be illuminated, thereby a color image is displayed.

The flat display body 2 is fixed to the flat metal chassis 3 formed of aluminum or the like by an adhesive material 6 such as a double-side adhesive tape or the like and integrated therewith.

Draw-out terminals (hereinafter referred to as column electrode terminals) connected with the column electrodes are formed in alignment at a side edge 7 of the front surface of the back glass substrate 5, and draw-out terminals (hereinafter referred to as row electrode terminals) connected with the row electrode pairs are formed in alignment also at a side edge (not shown) of the back surface of the front glass substrate 4.

Wiring patterns for predetermined signal transmission are previously formed in addition to grounding wiring patterns and power source on the flexible substrate 8, and a driving device module, which is the flexible substrate 8 previously mounted with the driving devices 9, is formed by electrically connecting a plurality of driving devices 9 to these wiring patterns. Then, an edge 15 of the flexible substrate 8 composing the module is fixed to the side edge 7 of the back glass substrate 5 and the above-described side edge of the front glass substrate 4, and a predetermined connecting edges of the wiring patterns formed at the edge 15 of the flexible substrate 8 are electrically connected with the column electrode terminals and row electrode terminals through an anisotropic conductive adhesive sheet or the like, thus the driving device module and the display body 2 are electrically connected.

Here, the driving device module is formed in the following way. In FIG. 2, the predetermined wiring patterns are previously formed on the flexible substrate 8, thereby formed is the flexible substrate 8 capable of applying a surface mounting technology (SMT).

The driving devices 9 which are mounted on the flexible substrate 8 are used in a state of so-called bear chips without being packaged. In the final processing or the like of a semiconductor manufacturing process, unnecessary oxide films are removed by polishing back surfaces of substrates of the driving devices 9, and metal films 10 for grounding are formed by sputtering or metal plating chromium and gold thin films on the back surfaces of the substrates from which the oxide films are removed.

When the driving devices 9 are mounted on the flexible substrate 8, the driving devices 9 are positioned relative to the flexible substrate 8 and disposed, while automatically carrying the flexible substrate 8 by an automatic mounting machine. Here, sides of bonding pads or electric circuit surfaces formed on the driving devices 9 are contacted to the wiring patterns of the flexible substrate 8, and the metal films 10 of the driving devices 9 are disposed facing upward relative to the flexible substrate 8.

Furthermore, a solder paste 12 is coated on the surfaces of the grounding wiring patterns 11 and the surfaces of the metal films 10 of the driving devices 9, both of which are formed on the flexible substrate 8. Then, a metal plate 13 of higher heat radiation such as a copper plate is disposed on the solder paste (cream solder) 12. Lastly, the driving devices 9 are connected with the grounding wiring patterns 11 through the metal plate 13 by re-flow soldering.

By virtue of such structure, formed is a device IC module capable of efficiently radiating the heat generated by the driving devices 9 through the metal plate 13, and also capable of sufficiently stabilizing a ground potential of the driving devices 9.

Next, the edge 15 of the flexible substrate 8 is fixed to the side edge 7 of the back glass substrate 5 and the above-described side edge of the front glass substrate 4 as described above when the device IC module thus formed is mounted on the display body 2 and the metal chassis 3 shown in FIG. 1. Then, the predetermined connecting edges of the wiring patterns formed at the edge 15 of the flexible substrate 8 are electrically connected with the column electrode terminals and row electrode terminals through the anisotropic conductive adhesive sheet or the like. Furthermore, the metal plate 13 is fixed to the back surface of the metal chassis 3 by an adhesive material 14 such as a heat conductive adhesive tape superior in the heat conductivity, by introducing the flexible substrate 8 to a back surface side of the metal chassis 3, thereby manufactured is the color plasma display panel 1 in a unit before subjected to decorative treatment or the like.

In this way, according to the mounting structure of the driving devices of the present embodiment, the heat generated when the display body 2 is driven for displaying by the driving devices 9 is efficiently conducted to the metal plate 13 through the solder paste 12, thus the heat radiation of the apparatus can be improved.

Further, the metal plate 13 is bonded to the metal chassis 3 by the adhesive material 14 superior in the thermal conductivity, thus the extremely advantageous heat radiation can be obtained.

In addition, on the back surfaces of the driving devices 9 (back surfaces of the substrates) is formed the metal films 10 through removing the oxide films or the like thereon. The metal films 10 and the grounding wiring patterns 11 mounted inside the flexible substrate 8 are connected through the metal plate 13, which is soldered on both the metal film 10 and the grounding wiring patterns 11. Thus, the ground potential of the driving devices 9 can be maintained at the same level as that of the grounding wiring patterns of the flexible substrate 8 through the metal plate 13. As a result, the withstand voltage characteristic can be improved.

Furthermore, the metal plate 13 can be united with the flexible substrate 8 in the same process as the mounting of the driving devices 9 or other electronic parts on the printed substrate 8, thereby the production cost of the apparatus can be reduced.

Moreover, both of the heat radiation and the withstand voltage characteristic of the driving devices can be improved by the simple mounting structure, thus the mounting density of the driving devices can be improved.

Figure 3:
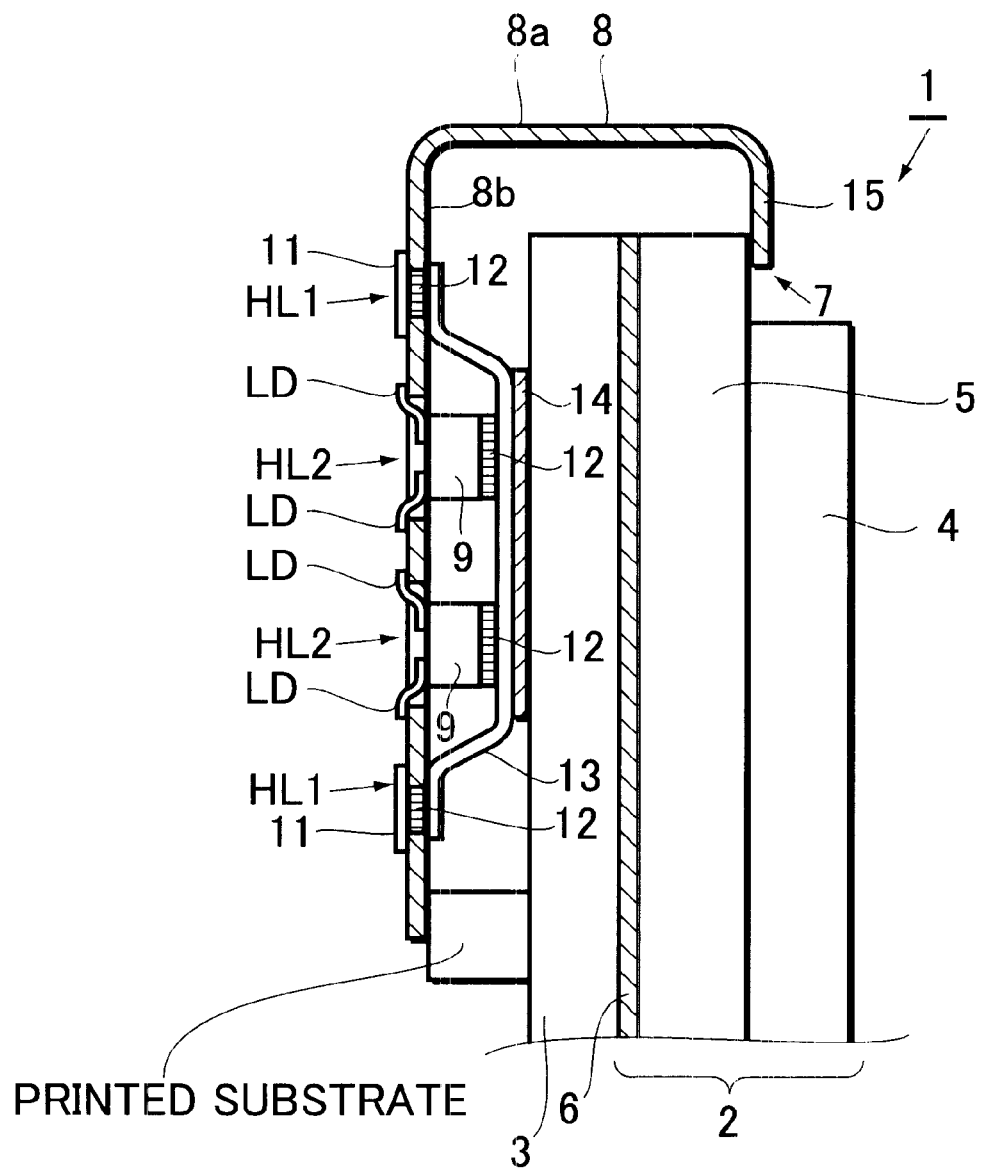
FIG. 3 is a sectional view illustrating a longitudinal sectional structure of a critical portion of a color plasma display panel according to another embodiment.

FIG. 3 is a longitudinal sectional view of a critical portion illustrating another embodiment of the present invention. It should be noted that, in FIG. 3, equivalent portions with those in FIG. 1 are designated by the same reference numerals.

One of the differences in structure of the flat panel type display apparatus shown in FIG. 3 from that shown in FIG. 1 is that the grounding wiring patterns 11 formed on the wiring pattern forming surface 8a of the flexible substrate 8 are fixed to the metal plate 13 disposed on a surface 8b opposed with the surface 8a, namely a surface opposite to the surface where the grounding wiring patterns 11 are formed, by soldering (soldering with the solder paste 12) through one or a plurality of apertures HL1 formed on the flexible substrate 8.

Furthermore, the driving devices 9 are connected with the wiring patterns on the wiring pattern forming surface 8a of the flexible substrate 8 by one or a plurality of metal lead members LD through one or a plurality of apertures HL2 formed on the flexible substrate 8.

In this way, according to the other embodiment, a large size metal plate 13 can be mounted while previously preventing short circuit (electrical short circuit) with the wiring patterns by directly mounting the metal plate 13 on the surface 8b opposite to the wiring pattern forming surface 8a of the flexible substrate 8, and also a plurality of apertures HL1, HL2 are provided on the flexible substrate 8, thus the heat radiation of the driving devices can be further improved.

As described heretofore, according to the present invention, metal films are formed on the back surfaces of the driving devices, and the metal films and the grounding wiring patterns of the flexible substrate are fixed by soldering to a metal plate for heat radiating, thus the heat generated when the driving devices drive a display body for displaying is efficiently conducted to the metal plate, thereby the heat radiation can be improved. Furthermore, the back surfaces of the driving devices are conducted with the grounding wiring patterns of the flexible substrate through the metal plate, thereby the withstand voltage characteristic of the driving devices can be improved. Furthermore, the metal plate can be united with the flexible substrate in the same process as mounting of the driving devices onto the printed substrate, thus the production cost of the apparatus can be reduced. Moreover, since both the heat radiation and withstand voltage characteristic can be improved by the simple mounting structure, provided is the mounting structure capable of achieving advantages such as improvement in mounting density of the driving devices and the like.

While the invention has been described in conjunction with preferred specific embodiments thereof, it will be understood that this description is intended to illustrate and not limit the scope of the invention, which is defined by the following claims.

What is claimed is:

1. A flat panel type display apparatus, comprising:
   a flat display body;
   a metal chassis for supporting said display body at the back surface thereof;
   a flexible substrate electrically connected with said display body, having predetermined wiring patterns including grounding wiring patterns formed thereon;
   driving devices mounted on said flexible substrate;
   a metal film formed on a back surface of each of said driving devices; and
   a metal plate for radiating heat provided between said metal chassis and said driving devices,
   wherein said metal film and said grounding wiring patterns mounted on said flexible substrate are fixed onto said metal plate for radiating the heat by soldering, so that said driving devices and said grounding wiring patterns can be electrically connected with each other.

2. The flat panel type display apparatus according to claim 1, wherein:
   said metal plate for radiating heat is bonded to said metal chassis through a thermally conductive adhesive tape.

3. The flat panel type display apparatus according to claim 1, wherein:
   said flat panel type display apparatus is a plasma display having color discharge cells formed on said display body to be driven by said driving devices.

4. The flat panel type display apparatus according to claim 2, wherein:
   said flat panel type display apparatus is a plasma display having color discharge cells formed on said display body to be driven by said driving devices.

5. The flat panel type display apparatus according to claim 1, wherein:
   said driving devices are semiconductor integrated circuit devices.

6. The flat panel type display apparatus according to claim 1, wherein:
   said flexible substrate is for printing wiring patterns thereon.

7. The flat panel type display apparatus according to claim 1, wherein:
   said flexible substrate has a plurality of apertures thereon, and further
   said driving devices are connected with said wiring patterns formed on an outside surface of the flexible substrate by metal lead members passing through said apertures.

* * * * *